(12) United States Patent
Zhang

(10) Patent No.: US 8,736,177 B2
(45) Date of Patent: May 27, 2014

(54) COMPACT RF ANTENNA FOR AN INDUCTIVELY COUPLED PLASMA ION SOURCE

(75) Inventor: Shouyin Zhang, Portland, OR (US)

(73) Assignee: FEI Company, Hillsboro, OR (US)

(*) Notice: Subject to any disclaimer, the term of this patent is extended or adjusted under 35 U.S.C. 154(b) by 780 days.

(21) Appl. No.: 12/894,779

(22) Filed: Sep. 30, 2010

(65) Prior Publication Data

US 2012/0080148 A1 Apr. 5, 2012

(51) Int. Cl.
*H01J 7/24* (2006.01)
(52) U.S. Cl.
USPC ............ 315/111.81; 315/111.01; 315/111.91; 315/111.21; 156/345.3; 156/345.48
(58) Field of Classification Search
USPC ............ 315/111.01, 111.11, 111.21, 111.31, 315/111.41, 111.51, 111.61, 111.71, 315/111.81, 111.91; 156/345.3, 345.48
See application file for complete search history.

(56) References Cited

U.S. PATENT DOCUMENTS

| | | | |
|---|---|---|---|
| 4,725,449 A | 2/1988 | Ehlers et al. | |
| 5,681,418 A | 10/1997 | Ishimaru | |
| 5,686,796 A | 11/1997 | Boswell et al. | |
| 6,017,221 A | 1/2000 | Flamm | |
| 6,124,834 A | 9/2000 | Leung et al. | |
| 6,385,977 B1 | 5/2002 | Johnson | |
| 6,417,626 B1 * | 7/2002 | Brcka et al. | 315/111.51 |
| 6,692,622 B1 | 2/2004 | Colpo et al. | |
| 6,768,120 B2 | 7/2004 | Leung et al. | |
| 6,806,437 B2 | 10/2004 | Oh | |
| 6,975,072 B2 * | 12/2005 | Leung et al. | 315/111.21 |
| 7,241,361 B2 | 7/2007 | Keller et al. | |
| 7,670,455 B2 | 3/2010 | Keller et al. | |
| 8,168,957 B2 | 5/2012 | Keller et al. | |
| 2003/0095072 A1 * | 5/2003 | Kwon et al. | 343/720 |
| 2004/0163767 A1 | 8/2004 | Ueda et al. | |

(Continued)

FOREIGN PATENT DOCUMENTS

| | | |
|---|---|---|
| EP | 0849766 | 6/1998 |
| EP | 2341525 | 6/2011 |
| JP | WO2009110226 | * 9/2009 |
| KR | 20020079738 | 10/2002 |

OTHER PUBLICATIONS

Jiang, X., et al., "Mini rf-driven ion sources for focused ion beam systems," Review of Scientific Instruments, Apr. 2003, pp. 2288-2292, vol. 74, No. 4.

*Primary Examiner* — Douglas W Owens
*Assistant Examiner* — Jonathan Cooper
(74) *Attorney, Agent, or Firm* — Scheinberg & Assoc., PC; Michael O. Scheinberg

(57) ABSTRACT

An inductively coupled plasma ion source for a focused ion beam (FIB) system is disclosed, comprising an insulating plasma chamber with a feed gas delivery system, a compact radio frequency (RF) antenna coil positioned concentric to the plasma chamber and in proximity to, or in contact with, the outer diameter of the plasma chamber. In some embodiments, the plasma chamber is surrounded by a Faraday shield to prevent capacitive coupling between the RF voltage on the antenna and the plasma within the plasma chamber. High dielectric strength insulating tubing is heat shrunk onto the outer diameter of the conductive tubing or wire used to form the antenna to allow close packing of turns within the antenna coil. The insulating tubing is capable of standing off the RF voltage differences between different portions of the antenna, and between the antenna and the Faraday shield.

21 Claims, 11 Drawing Sheets

(56) References Cited

U.S. PATENT DOCUMENTS

| | | |
|---|---|---|
| 2007/0034154 A1 | 2/2007 | Fink |
| 2008/0017319 A1* | 1/2008 | Keller et al. ............. 156/345.48 |
| 2010/0044580 A1 | 2/2010 | Boswell et al. |
| 2010/0126964 A1 | 5/2010 | Smith et al. |
| 2012/0080148 A1* | 4/2012 | Zhang ....................... 156/345.3 |

* cited by examiner

FIG. 1 *PRIOR ART*

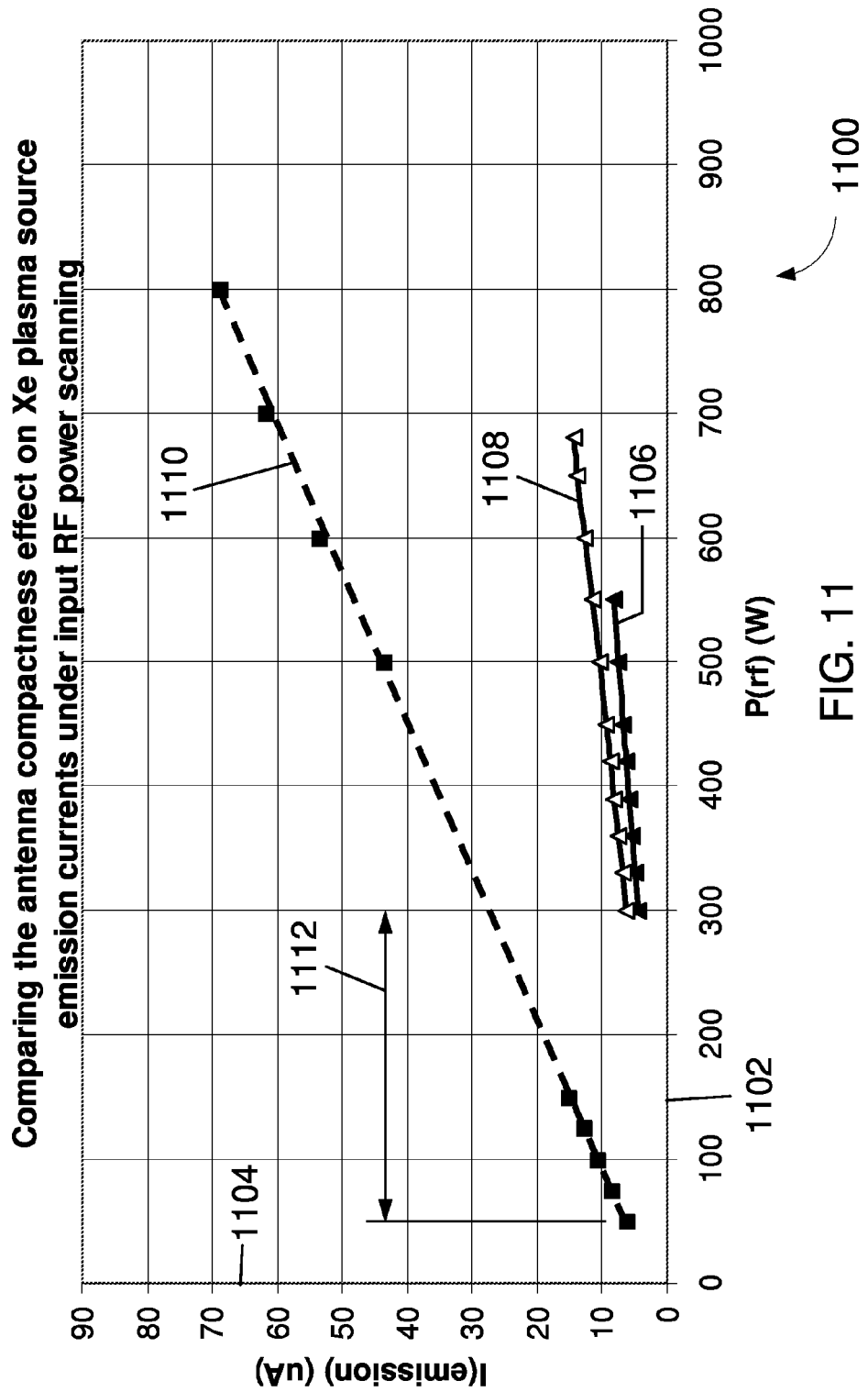

COMPACT RF ANTENNA FOR AN INDUCTIVELY COUPLED PLASMA ION SOURCE

TECHNICAL FIELD OF THE INVENTION

The present invention relates to inductively coupled plasma ion sources used in focused ion beam (FIB) systems and more particularly, to an improved RF antenna suitable for efficient generation of high density plasmas.

BACKGROUND OF THE INVENTION

Inductively coupled plasma (ICP) sources have advantages over other types of plasma sources when used with a focusing column to form a focused beam of charged particles, i.e., ions or electrons. An inductively coupled plasma source, such as the one described in U.S. Pat. No. 7,241,361, which is assigned to the assignee of the present invention, is capable of providing charged particles within a narrow energy range, thereby reducing chromatic aberrations and allowing the charged particles to be focused to a small spot.

ICP sources typically include a radio frequency (RF) antenna mounted coaxially around an insulating plasma chamber. The RF antenna provides energy to ignite and maintain a plasma within the plasma chamber. Typically, RF antennas comprise a coil with a multiplicity of coaxial turns displaced axially with respect to each other, wherein the overall length of the RF antenna controls the axial extent of the plasma generated within the plasma chamber. RF antennas may be longer due to increased numbers of turns or due to larger inter-turn spacings—in this case, the plasma will also be longer within the plasma chamber. RF antennas may be shorter due to decreased numbers of turns or due to smaller inter-turn spacings—in this case, the plasma will be shorter within the plasma chamber. Increased numbers of turns may improve the coupling efficiency between the RF power supply which energizes the RF antenna and the plasma within the plasma chamber. However, a shorter coil may produce a more efficient plasma for ion generation since, for a given input RF power, the plasma density may be roughly inversely proportional to the axial length of the plasma, assuming the plasma diameter within the plasma chamber remains constant.

Thus, the preferred antenna configuration is the largest number of turns in the antenna coil within the shortest possible length. Clearly, this implies that closer inter-turn spacings (i.e., the distances between successive turns in an RF antenna) should be as small as possible. However, the power from the RF power supply generates high voltages across the antenna coil, inducing voltages between successive turns which may exceed 400 Vrf and may go up to several kVrf at high RF powers. Increasing the RF power usually leads to increased plasma density and higher source emission currents; however, high RF power places more demanding high voltage standoff requirements on the antenna turn-to-turn insulation, as well as on the insulation between the antenna and neighboring electrical components at different potentials.

As discussed in the prior art, a Faraday Shield structure made of highly conductive metal may be placed between the plasma chamber and the antenna to minimize capacitive RF voltage coupling into the plasma, which can dramatically increase the source beam energy spread. Focused ion beam systems require the lowest possible energy spreads to reduce chromatic aberrations which would be detrimental achieving fine probe beams. Thus, the optimal antenna design must provide adequate voltage standoff between turns and between the antenna and its neighboring electrical components, such as a Faraday Shield.

What is needed then is an improved inductively coupled plasma ion source for use in a focused ion beam system.

SUMMARY OF THE INVENTION

An object of the invention is to provide an improved inductively coupled plasma ion source used in a focused ion beam (FIB) system.

Embodiments of the invention provide a more compact and efficient RF antenna for igniting and/or sustaining a high density plasma in an inductively coupled plasma ion source used in a focused ion beam (FIB) system. More compact antennas are capable of generating higher density plasmas more efficiently, thereby enabling higher ion emission currents at lower RF input powers. A compact source capable of running at high RF powers, enabled by the compact antenna designs of some embodiments of the present invention, would broaden the plasma source operational parameter range, allowing for a wider range of optimized running modes and the capability for operating with multiple feed gases.

A preferred antenna coil is insulated using a high density insulating material, such as polytetrafluoroethylene (PTFE) plastic tubing, which demonstrates much higher dielectric strength (e.g., 55 kV/mm) than prior art insulating coatings (15.7 kV/mm), thereby enabling much more compact antenna designs with respect to inter-turn gaps and closeness of the antenna coil to a Faraday shield or plasma chamber. In some embodiments, the insulation material is formed by heat shrinking PTFE tubing to snugly and closely wrap around the current carrying conductor of the antenna.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 11 is a graph of plasma source emission currents as functions of the input RF power for the prior art and for the present invention.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Embodiments of the present invention provide a compact radio frequency (RF) antenna for an inductively coupled plasma source used in a focused charged particle beam system. An RF power supply is connected to this RF antenna through an impedance matching circuit to deliver RF power efficiently (i.e., with minimal reflected RF power back to the power supply). The RF antenna is preferably positioned around, and coaxial to, a plasma chamber to maximize the power coupling efficiency into the plasma generated within the plasma chamber. Embodiments of the invention provide RF antennas for inductively coupled plasma charged particle sources. In some embodiments, the coil is in contact with, or in close proximity to, a grounded Faraday shield which functions to shield the plasma against capacitively coupling to the RF voltage on the antenna. In other embodiments, the compact antenna coil of the present invention is cooled by being immersed in a dielectric coolant.

Figure 1:
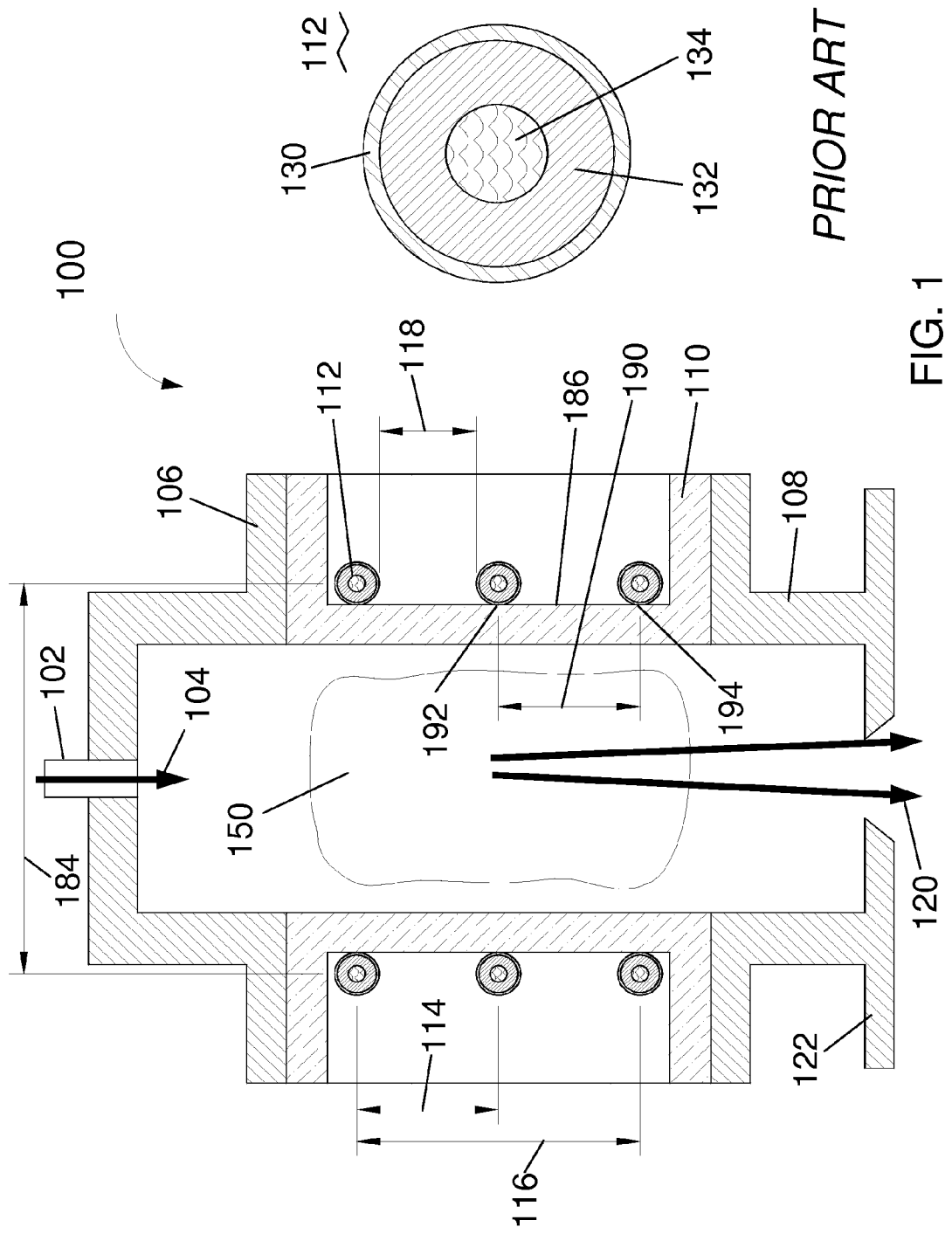
FIG. 1 shows a first prior art method for mounting an RF antenna around a plasma chamber, employing a deposited insulating coating on the antenna coil with large inter-turn spacings for high voltage standoff.

FIG. 1 shows a first prior art method for mounting an RF antenna 112 around a plasma chamber in an ion source 100 (U.S. Pat. No. 6,975,072 B2). The plasma chamber comprises three parts: an upper section 106 (which may comprise a first permanent magnet) and a lower section 108 (which may comprise a second permanent magnet), spaced apart by a center quartz flange 110 enclosing an RF antenna 112. A gas feed tube 102 at the top of the upper section 106 permits a regulated flow of a feed gas 104 (i.e., the gas to be ionized) to flow into the interior of the plasma chamber. A flange 122 at the bottom end of the lower section 108 enables mounting of the ion source 100 to a charged particle beam system (not shown). When power from an RF power supply (not shown) is connected to the antenna 112, an RF high voltage at typical frequencies of N×13.56 MHz (where N is an integer=1, 2, or 3) in the Industrial, Scientific and Medical (ISM) radio bands is generated across the antenna 112, thereby inducing a time-varying axial magnetic field within the plasma chamber. Through Maxwell's equations, this axial magnetic field induces an azimuthal time-varying electric field within the plasma chamber which generates and maintains the plasma 150. In some cases, the voltage differential between successive turns of the antenna 112 may exceed 400 Vrf, necessitating some form of high voltage insulation between neighboring turns of the antenna coil 112. Charged particles (ions or electrons) 120 may be extracted from the plasma 150 by a voltage applied to an extractor electrode (not shown) located below flange 122. As is demonstrated in FIGS. 7-11, optimum efficiency of RF power coupling from antenna 112 to the plasma 150 requires that the diameter 184 of the antenna 112 is minimized, while the length 116 of antenna 112 is also minimized. Minimizing the antenna diameter 184 makes the distance from the outside of the plasma 150 to the antenna as small as possible, while minimizing the antenna length 116 minimizes the volume of plasma 150, thereby maximizing the power density (W/cm$^3$) absorbed by the plasma 150 for a given RF input power. Higher plasma densities may enable higher ion emission currents in inductively-coupled plasma ion sources (see FIG. 11).

A detailed cross-sectional schematic view of one turn of the RF antenna 112 is shown at the right of FIG. 1. The coil tubing 132 material is typically copper which is annealed to enable winding of the coiled antenna structure 112 shown at the left of FIG. 1. In this prior art antenna, a thin insulating coating 130 has been applied to the outer surface of the coil tubing 132 through coating processes. For cooling, the coil tubing 132 has an inner circular tubular opening 134 through which a cooling fluid flows during operation of the plasma ion source 100. Since the cooling fluid is inside the electrically conducting coil tubing 132, there are no requirements on the cooling fluid with respect to dielectric or insulating properties. Choices for cooling fluids may include water (deionized or not), or dielectric fluorocarbon fluids like Fluorinert™. The RF antenna 112 is shown in contact with, or in close proximity to, the outer diameter 186 of the quartz flange 110. The insulating coating 130 will typically be characterized by a relatively low dielectric strength (e.g., 15.7 kV/mm) due largely to the limitations of coating technology, so that the induced RF voltage difference between successive turns of antenna 112 would exceed the voltage standoff capability between turns unless the inter-turn gap 118 is made large enough to support a majority of the inter-turn RF voltage difference across gap 118, and a smaller portion of the inter-turn RF voltage difference radially through the insulating coatings 130 on the neighboring turns. In cases where the turns of antenna 112 are in contact with the outer diameter 186 of the quartz flange 110, the RF voltage difference between turns must also be supported against surface tracking by the distance 190 across the outer diameter 186 of the quartz flange 110 from the point of contact 192 of the center turn to the point of contact of the lower turn 194. The center-to-center spacing 114 between neighboring turns is equal to the inter-turn gap 118 plus the outer diameter of the insulating coating 130. The overall length 116 of the antenna 112 (center-to-center) is:

$$\text{Coil Length 116}=(N-1)(\text{Inter-turn spacing 114}) \qquad [\text{Eq. 1}]$$

where N=the number of turns in antenna 112. The number of turns is determined by the length of plasma 150 desired within the plasma chamber, the RF power to be coupled to the plasma 150, the goal for the emission current in beam 120, and the pressure of the feed gas 104 within the plasma chamber.

In general, insulating coatings tend to be thin due to coating technology limitations, with lower densities than chunk solid materials of the same material. Lower densities lead to decreased dielectric strengths (e.g., a typical range from 8.6 kV/mm to 15.7 kV/mm) and therefore, poorer high voltage standoffs. Thus, since the inter-turn RF voltage difference increases with higher input RF power to the antenna 112, any limit on the inter-turn voltage standoff will also limit the maximum RF power available for plasma generation within the plasma chamber, and thus the maximum ion emission currents in beam 120.

The low dielectric strength of the insulating coating 130 has another disadvantage for the prior art plasma ion source in FIG. 1. The source configuration shown in FIG. 1 has a substantial amount of capacitive coupling between the antenna coil 112 and the plasma 150, which appears essentially as an equipotential volume within the plasma chamber. Thus, due to the high voltage across the RF antenna 112, the voltage of the plasma 150 will have a capacitively-coupled voltage induced on it which can affect the energies of the ions 120 emitted by the source 100. In many plasma ion sources, this capacitive voltage coupling is greatly reduced by the insertion of a Faraday shield (e.g., Faraday shield 298 in FIG. 2) between the RF antenna and the plasma chamber. Due to the low dielectric strength of the coating 130 on the coil 112, it is not possible to position a Faraday shield between the RF antenna 112 and the quartz flange 110 because there could be high voltage arcing through the thin insulating coating 130 between the coil tubing 132 and the Faraday shield.

Prior art antenna insulation coatings have also demonstrated other problems, such as lack of resistance to abrasion or cutting, cracking, aging, and insufficient flexibility for winding antennas with complex shapes as discussed in U.S. Pat. Nos. 4,725,449 and 6,124,834.

Figure 2:
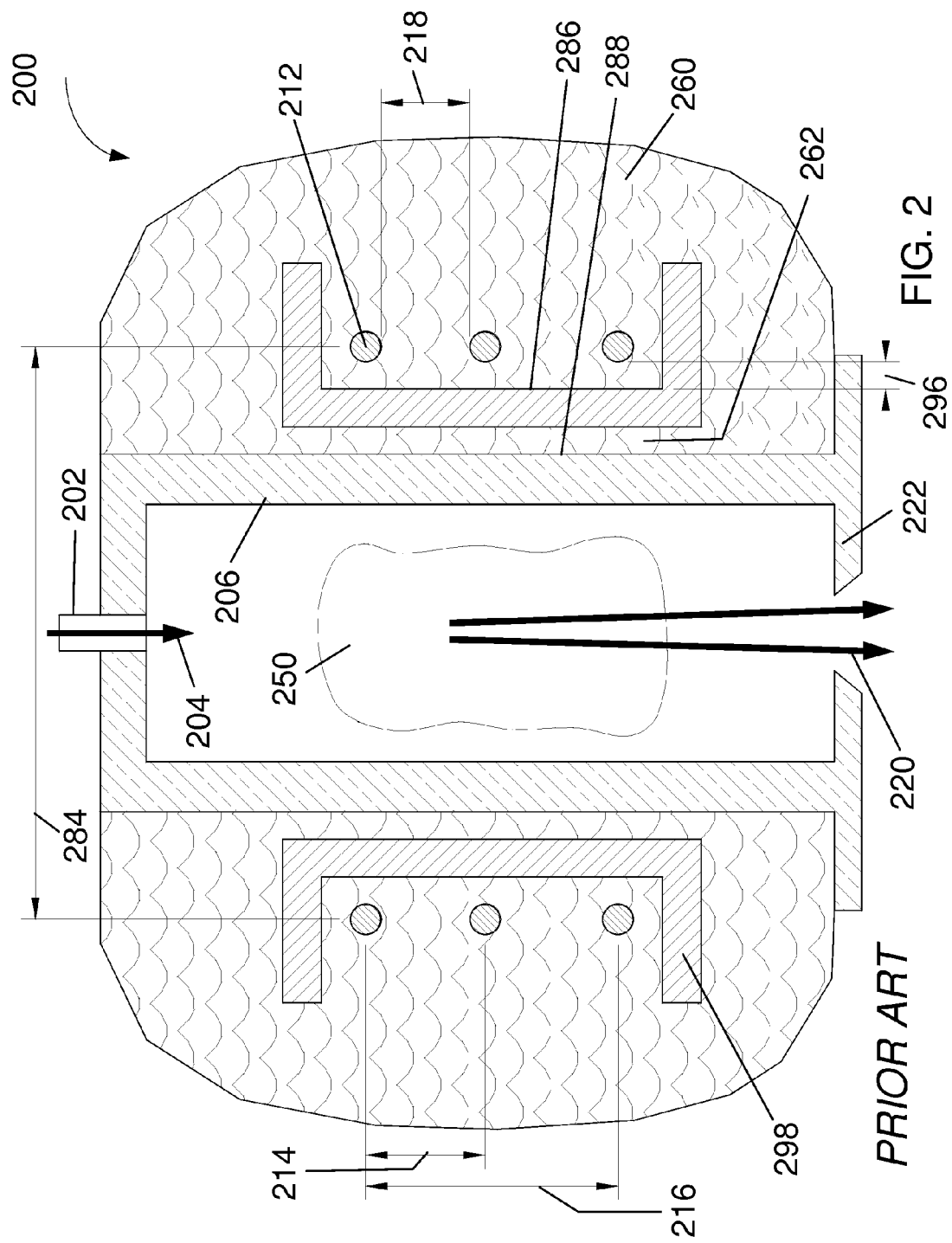
FIG. 2 shows a second prior art method for mounting an RF antenna around a plasma chamber, employing an insulating fluid to provide both high voltage standoff between turns of the antenna coil and cooling for the coil.

FIG. 2 shows a second prior art method for mounting an RF antenna 212 around a plasma chamber 206 in an ion source 200. The plasma chamber 206 has a gas feed tube 202 at the top to permit a regulated flow of a feed gas 204 (i.e., the gas to be ionized) to flow into the interior of the plasma chamber 206. A flange 222 at the bottom end of the plasma chamber 206 enables mounting of the ion source 200 to a charged particle beam system (not shown). When power from an RF power supply (not shown) is connected to the antenna 212, an RF high voltage at typical frequencies of N×13.56 MHz (where N is an integer=1, 2, or 3) in the Industrial, Scientific and Medical (ISM) radio bands is generated across the antenna 212, thereby generating a time-varying axial magnetic field within the plasma chamber 206. Through Maxwell's equations, as in FIG. 1, this magnetic field induces an azimuthal time-varying electric field within the source chamber 206 which generates and maintains the plasma 250. In some cases, the voltage differential between successive turns of the antenna 212 may exceed 400 Vrf, necessitating some form of high voltage insulation between neighboring turns of the antenna coil 212. Charged particles (electrons or ions) 220 may be extracted from the plasma 250 by a voltage applied to an extractor electrode (not shown) located below flange 222. The same considerations about the antenna diameter 284 and length 216 apply for this second prior art inductively coupled plasma ion source—optimum efficiency requires the minimum radial distance between the antenna 212 and the plasma 250, and the overall length 216 of the coil should be minimized to maximize the power density (W/cm³) absorbed by the plasma 250 for a given RF input power. Higher plasma densities may enable higher ion emission currents in inductively-coupled plasma ion sources (see FIG. 11).

The RF antenna 212 in FIG. 2 uses uninsulated turns of a solid antenna wire (typically copper). The antenna 212 is immersed in a dielectric insulating fluid 260 which provides the entire high voltage standoff between successive turns in the antenna 212. Note that here, unlike the case in FIG. 1, the insulating properties of the coolant fluid 260 are critically important for preventing high voltage breakdown between neighboring turns of the antenna coil 212, or breakdown between turns of the antenna coil 212 and the (grounded) Faraday shield 298. It is also important that the cooling fluid 260 be electrically transparent (i.e., minimally-absorbing) at the radio frequency driving the antenna 212. The center-to-center spacing 214 between neighboring turns of the antenna 212 is equal to the turn-to-turn gap 218 plus the diameter of the antenna wire. The overall length 216 (center-to-center) of the antenna 212 is:

Coil Length 216=(N−1)(Inter-turn spacing 214)     [Eq. 2]

where N=the number of turns in antenna 212. In FIG. 2, the Faraday shield 298 is separated by a small gap 262 from the outer diameter 288 of the plasma chamber 206. The outer diameter 286 of the Faraday shield 298 is separated by a small gap 296 from the inner surfaces of the turns in the RF antenna 212—this small gap may determine the maximum voltage standoff between any portion of the antenna 212 and the Faraday shield 298, which typically will be an electrical conductor biased at ground potential.

First Embodiment of the Invention

Figure 3:
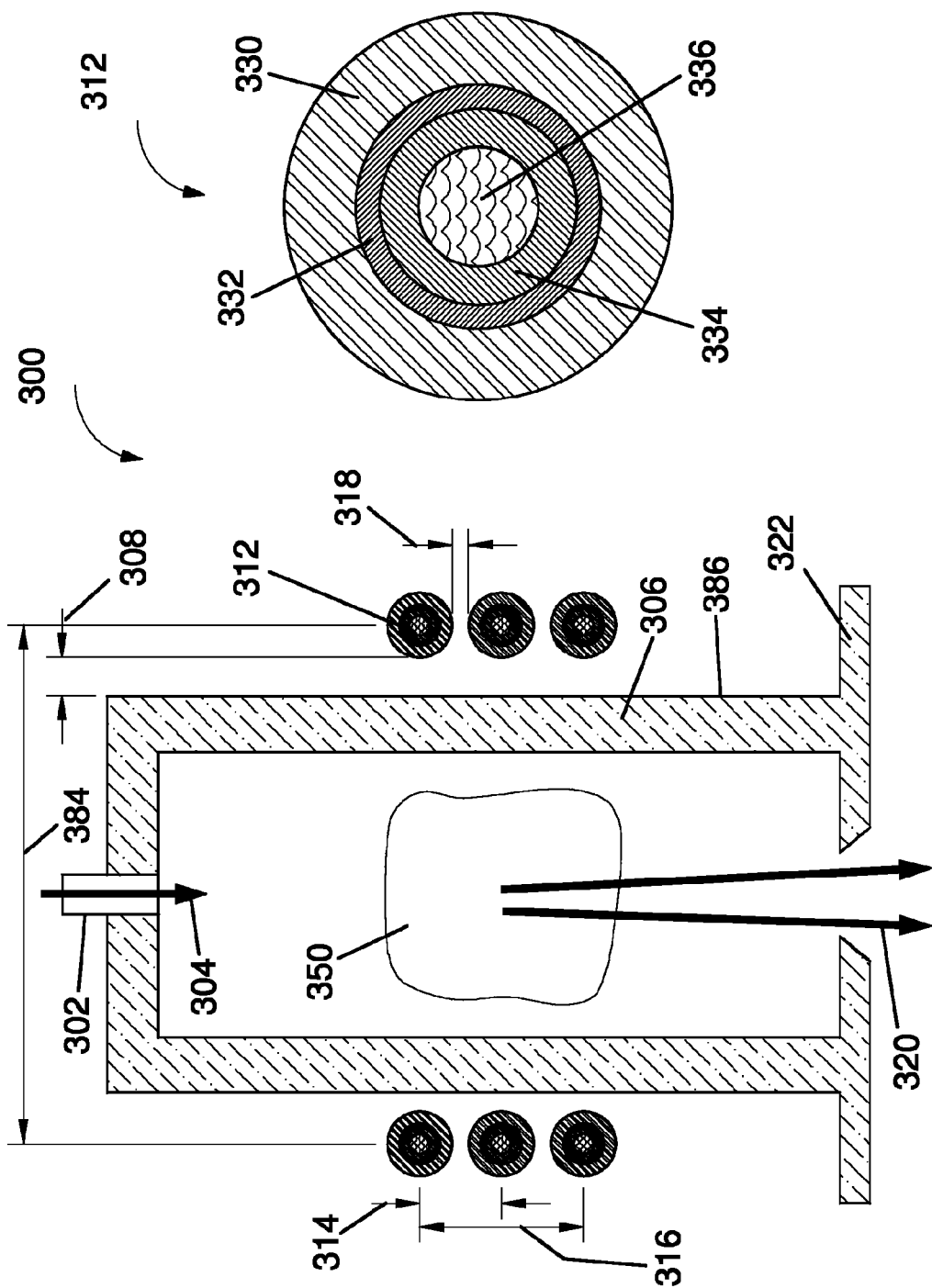
FIG. 3 is a schematic side cross-sectional view of a first embodiment of the invention employing an RF antenna with turns spaced away from the outer diameter of the plasma chamber and with inter-turn gaps.

FIG. 3 is a schematic side cross-sectional view of a first embodiment 300 of the present invention employing an RF antenna 312 with turns spaced a distance 308 from the outer diameter 386 of the plasma chamber 306 and with inter-turn gaps 318 which are much smaller (typically less than half of the outer diameter of the insulating layer 330) than those in the prior art inductively coupled plasma ion source in FIG. 1. A gas feed tube 302 at the top of the plasma chamber 306 permits a regulated flow of a feed gas 304 (i.e., the gas to be ionized) to flow into the interior of the plasma chamber 306. A flange 322 at the bottom end of the plasma chamber 306 enables mounting of the ion source 300 to a charged particle beam system (not shown). When power from an RF power supply (not shown) is connected to the antenna 312 (usually through an impedance matching circuit, not shown), an RF high voltage at typical frequencies of N×13.56 MHz (where N is an integer=1, 2, or 3) in the Industrial, Scientific and Medical (ISM) radio bands is generated across the antenna 312 which generates a time-varying axial magnetic field within the plasma chamber. Through Maxwell's equations, this magnetic field induces an azimuthal time-varying electric field within the source chamber which generates and maintains the plasma 350. In some cases, the voltage differential between successive turns of the antenna coil 312 may exceed 400 Vrf, necessitating some form of high voltage insulation between neighboring turns of the antenna coil 312. Charged particles (ions or electrons) 320 may be extracted from the plasma 350 by a voltage applied to an extractor electrode (not shown) located below flange 322. The same considerations for the antenna diameter 384 and length 316 apply for this first embodiment of the invention as for the prior art—optimum efficiency requires the minimum radial distance between the antenna 312 and the plasma 350, and the overall length 316 of the coil should be minimized to maximize the power density (W/cm³) absorbed by the plasma 350 for a given RF power, potentially enabling higher emission currents in charged particle beam 320 (see FIG. 11). Another consideration in maximizing emission currents is the total volume of the plasma 350—typically, plasma volumes exceeding about 2 cm³ will be less efficient in ion beam production since only a small portion [typically ~15 μm³] of the plasma 350 contributes to the current in the ion beam 320.

A detailed cross-sectional schematic view of one turn of the RF antenna 312 is shown at the right of FIG. 3. The coil tubing 334 material is typically oxygen-free high-conductivity (OFHC) copper (with a typical diameter range from 2 to 10 mm, and a preferred range from 3 to 6 mm) which is annealed to enable winding of the coiled antenna structure 312 shown at the left of FIG. 3. The outer surface of coil tubing 334 may have a conductive layer 332 (e.g., silver or gold) applied to reduce the coil resistance at RF frequencies. As an example, the skin depth, δ, as a function of frequency is:

$$\delta(f) = L f^{-0.5} (\delta \text{ and } L \text{ in } \mu m, \text{ and } f \text{ in MHz}) \quad [\text{Eq. 3}]$$

where L has the following values for common coil materials: L=80 μm (Al), 65 μm (Cu), 79 μm (Au), and 64 μm (Ag). Thus, for example, at 40 MHz, the skin depth for a silver layer 332 will be approximately 10.1 μm, so if the thickness of layer 332 is at least 20 to 100 μm (i.e., 2 to 10 times the skin depth, δ), almost all the current in antenna coil 312 will flow in layer 332, and not in coil tubing 334. The thickness of layer 332 may range from 20 to 100 μm, and preferably from 25 to 50 μm.

Thick high density insulating tubing 330, typically fabricated from PTFE plastic, has been heat-shrunk onto the outer surface of conductive layer 332, or onto the outer surface of coil tubing 334 if no conductive layer 332 is used. A typical wall thickness range for the high dielectric strength insulating tubing 330 is 250 μm to 1250 μm. A preferred wall thickness range for insulating tubing 330 is 380 μm to 750 μm. The outer diameter of the insulating tubing 330 will be determined by the diameter of coil tubing 334 plus twice the thickness of conductive layer 332 plus twice the thickness of insulating layer 330—giving a typical range from 2.54 mm [=2 mm+2 (20 μm)+2 (250 μm)] to 12.7 mm [=10 mm+2 (100 μm)+2 (1250 μm)], and a more preferred range from 3.81 mm [=3 mm+2 (25 μm)+2 (380 μm)] to 7.6 mm [=6 mm+2 (50 μm)+2 (750 μm)].

For cooling, the coil tubing 334 has an inner circular tubular opening 336 (typical diameters from 1 to 6 mm, and preferred diameters from 1.5 to 3 mm) through which a cooling fluid flows during operation of plasma ion source 300. Since the cooling fluid is inside the electrically conducting coil tubing 334, there are no requirements on the cooling fluid with respect to dielectric or insulating properties or RF transparency. Choices for cooling fluids may include water (deionized or not), or dielectric fluorocarbon fluids such as Fluorinert™, or transformer oil. The RF antenna 312 is shown in close proximity to the outer diameter 386 of the plasma chamber 306 with a gap 308. The insulating tubing 330 will typically be characterized by a relatively high dielectric strength, so that the induced RF voltage difference between turns of antenna 312 will not exceed the voltage standoff capability between turns even when the interturn gap 318 is much smaller than the wall thickness of insulating tubing 330. As used herein, the phrase "relatively high dielectric strength" will be used to describe insulating tubing having roughly double the dielectric strength as the prior art insulated coatings described above. Preferably, insulating tubing characterized by a relatively high dielectric strength according to the present invention will have a dielectric strength of greater than 25 kV/mm; more preferably a dielectric strength greater than 30 kV/mm; and even more preferably a dielectric strength ranging from 31.5 kV/mm to 55 kV/mm.

The center-to-center spacing 314 between neighboring turns in coil 312 is equal to the inter-turn gap 318 plus the outer diameter of the insulating tubing 330. The overall length 316 (center-to-center) of the antenna 312 is:

$$\text{Coil Length } 316 = (N-1)(\text{Inter-turn spacing } 314) \quad [\text{Eq. 4}]$$

where N=the number of turns in antenna 312. Typically, N may range from 2 to 10, with a more preferred range from 3 to 5. Comparison of the compact antenna 312 in FIG. 3 with the prior art plasma ion source 100 in FIG. 1 shows the benefits of the higher dielectric strength insulating tubing 330, as compared with the low dielectric strength insulating coating 130 of the prior art. The overall coil length 316 has been substantially reduced because the interturn gaps 318 can be proportionately much smaller than the interturn gaps 118 for the prior art antenna 112. This reduction in gap distance 318 is possible because the bulk of the inter-turn voltage difference within antenna 312 can be withstood across the thickness of the walls of insulating tubing 330, and only a small portion of the voltage drop need appear across the gap 318. This contrasts with the prior art situation where the bulk of the inter-turn voltage difference had to be sustained across the gap 118.

Second Embodiment of the Invention

Figure 4:
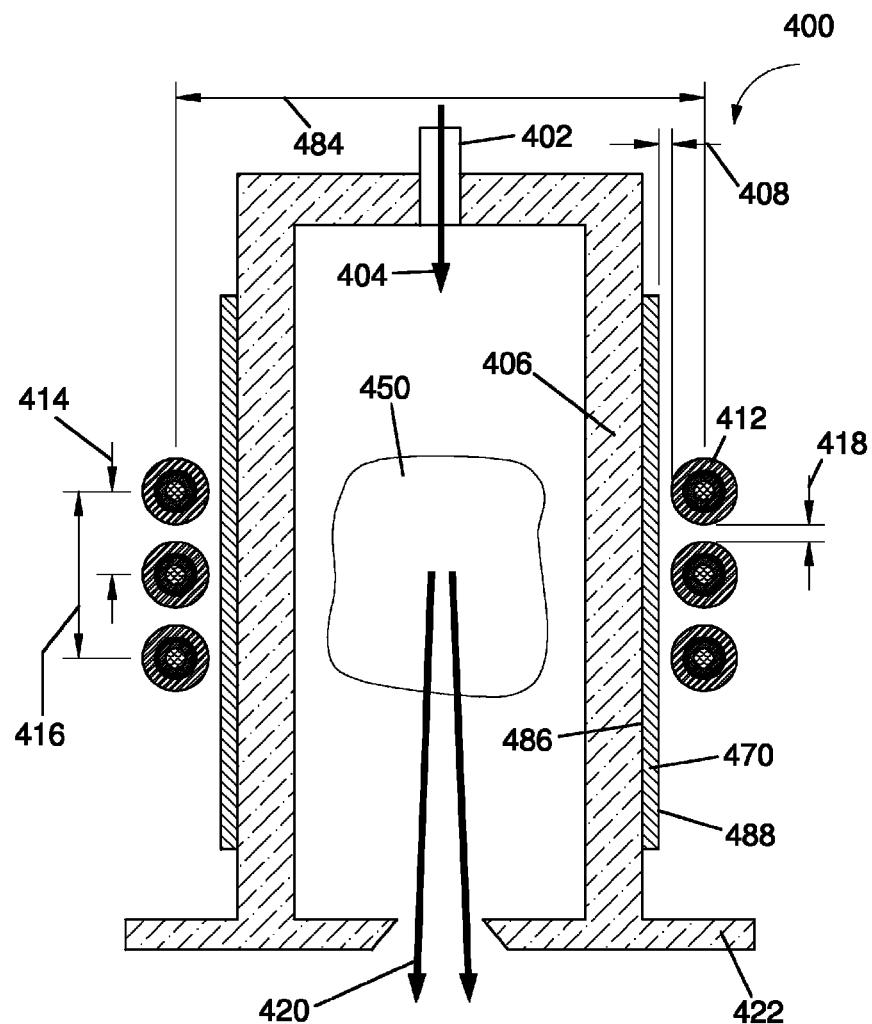
FIG. 4 is a schematic side cross-sectional view of a second embodiment of the invention employing an antenna structure similar to the first embodiment in FIG. 3, but with a Faraday shield between the antenna and plasma chamber.

FIG. 4 is a schematic side cross-sectional view of a second embodiment 400 of the present invention employing an RF antenna 412 with turns spaced a distance 408 from the outer diameter 488 of a Faraday shield 470 and with inter-turn gaps 418 which may be much smaller than the inter-turn gaps 118 in the prior art plasma ion source 100 in FIG. 1. A gas feed tube 402 at the top of the plasma chamber 406 permits a regulated flow of a feed gas 404 (i.e., the gas to be ionized) to flow into the interior of the plasma chamber 406. A flange 422 at the bottom end of the plasma chamber 406 enables mounting of the ion source 400 to a charged particle beam system (not shown). When power from an RF power supply (not shown) is connected to the antenna 412 (usually through an impedance matching circuit, not shown), an RF high voltage at typical frequencies of N×13.56 MHz (where N is an integer=1, 2, or 3) in the Industrial, Scientific and Medical (ISM) radio bands is generated across the antenna 412 which generates a time-varying axial magnetic field within the plasma chamber, as for the first embodiment. In some cases, the voltage differential between successive turns of the antenna coil 412 may exceed 400 Vrf, necessitating some form of high voltage insulation between neighboring turns of the antenna coil 412. Charged particles (ions or electrons) 420 may be extracted from the plasma 450 by a voltage applied to an extractor electrode (not shown) located below flange 422. The same considerations for the antenna diameter 484 and length 416 apply here as for the first embodiment of the invention—optimum efficiency requires the minimum radial distance between the antenna 412 and the plasma 450, and the overall length 416 of the coil should be minimized to maximize the power density (W/cm$^3$) absorbed by the plasma 450 for a given RF power, potentially enabling higher emission currents in the charged particle beam 420 (see FIG. 11). The same considerations for the maximum desirable plasma volume apply as for the first embodiment.

The cross-sectional detail of one turn of the RF antenna 412 is the same as that shown at the right side of FIG. 3 for the first embodiment. The same considerations for the choice of cooling fluid, for the diameter of the coil tubing 334, for the thickness of the conductive layer 332, and for the thickness and outer diameter of the insulating layer 330 apply here as for the first embodiment.

The center-to-center spacing 414 between neighboring turns in coil 412 is equal to the inter-turn gap 418 plus the outer diameter of the insulating tubing 330. The overall length 416 of the antenna 412 is:

$$\text{Coil Length } 416 = (N-1)(\text{Inter-turn spacing } 414) \quad [\text{Eq. 5}]$$

where N=the number of turns in antenna 412. Typically, N may range from 2 to 10, with a more preferred range from 3 to 5. The key difference between the second embodiment in FIG. 4 and the first embodiment in FIG. 3 is the addition of a Faraday shield 470, near to, or in contact with, the outer diameter 486 of the plasma chamber 406. As discussed for FIG. 2, the Faraday shield 470 electrically shields the plasma 450 from the RF voltage on the antenna 412, thereby preventing capacitive coupling of the RF coil voltage into the energies of the ions 420 emitted by the plasma ion source 400. An additional benefit for the high dielectric strength insulating tubing 330 is that the voltage difference between both the coil conductor 334 and the conductive layer 332, and the Faraday shield 470 can be mainly supported across the wall thickness of the insulating tubing 330, not by the gap 408, thus gap 408 may be made smaller or completely eliminated, thereby improving the RF power coupling efficiency from antenna 412 to the plasma 450. The same benefits for construction of a compact antenna 412 apply here as for antenna 312 in FIG. 3—the overall coil length 416 may be substantially reduced because the interturn gaps 418 can be proportionately much smaller than the interturn gaps 118 for the prior art antenna 112. This reduction in the size of gap 418 is possible because the bulk of the interturn voltage difference within antenna 412 can be withstood across the wall thickness of insulating tubing 330, and only a small portion of the voltage drop need appear across the gap 418. This contrasts with the prior art situation where the bulk of the interturn voltage difference had to be sustained by the gap 118.

Third Embodiment of the Invention

Figure 5:
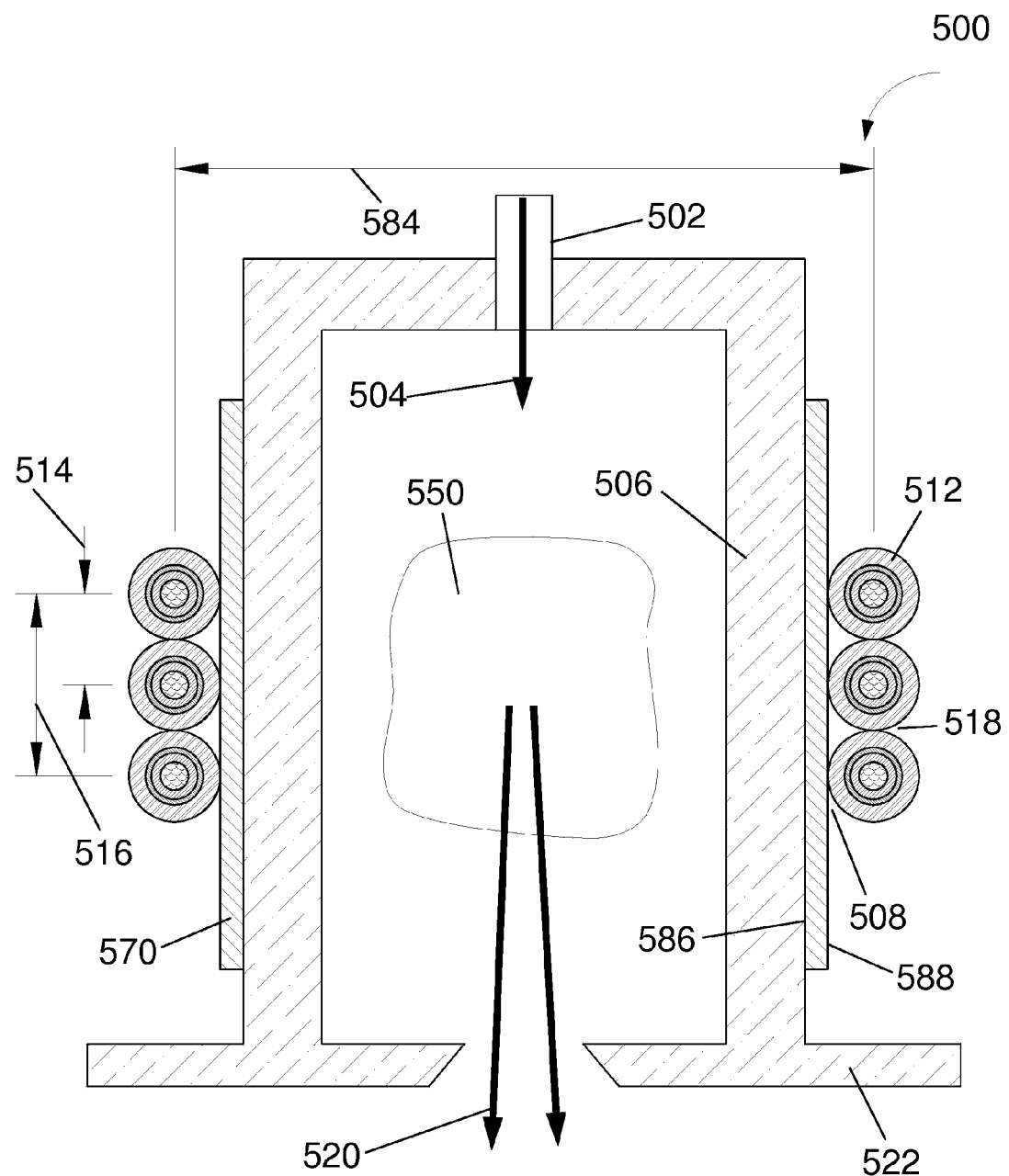
FIG. 5 is a schematic side cross-sectional view of a third embodiment of the invention employing an RF antenna with turns in contact with the Faraday shield and no inter-turn gaps.

FIG. 5 is a schematic side cross-sectional view of a third embodiment 500 of the invention employing an RF antenna 512 with turns in contact with the Faraday shield 570 and no inter-turn gaps. A gas feed tube 502 at the top of the plasma chamber 506 permits a regulated flow of a feed gas 504 (i.e., the gas to be ionized) to flow into the interior of the plasma chamber 506. A flange 522 at the bottom end of the plasma chamber 506 enables mounting of the ion source 500 to a charged particle beam system (not shown). When power from an RF power supply (not shown) is connected to the antenna 512 (usually through an impedance matching circuit, not shown), an RF high voltage at typical frequencies of N×13.56 MHz (where N is an integer=1, 2, or 3) in the Industrial, Scientific and Medical (ISM) radio bands is generated across the antenna 512 which generates a time-varying axial magnetic field within the plasma chamber, as for the first 300 and second 400 embodiments in FIGS. 3 and 4, respectively. In some cases, the voltage differential between successive turns of the antenna coil 512 may exceed 400 Vrf, necessitating some form of high voltage insulation between neighboring turns of the antenna coil 512. Charged particles (ions or electrons) 520 may be extracted from the plasma 550 by a voltage applied to an extractor electrode (not shown) located below flange 522. The same considerations for the antenna diameter 584 and length 516 apply here as for the first and second embodiments of the invention—optimum efficiency requires the minimum radial distance between the antenna 512 and the plasma 550, and the overall length 516 of the coil should be minimized to maximize the power density (W/cm$^3$) absorbed by the plasma 550 for a given RF power, potentially enabling higher emission currents in the charged particle beam 520 (see FIG. 11). The same considerations for the maximum desirable plasma volume apply as for the first and second embodiments.

The cross-sectional detail of one turn of the RF antenna 512 is the same as that shown at the right side of FIG. 3 for the first embodiment. The same considerations for the choice of cooling fluid, for the diameter of the coil tubing 334, for the thickness of the conductive layer 332, and for the thickness and outer diameter of the insulating layer 330 apply here as for the first and second embodiments.

The center-to-center spacing 514 between neighboring turns in coil 512 is equal to the outer diameter of the insulating tubing 330 since successive turns of antenna coil 512 touch at contact points 518 (i.e., there are no gaps between successive turns). This absence of gaps between successive turns in coil 512 is possible because the entire inter-turn voltage difference within antenna 512 can be withstood across the wall thickness of insulating tubing 330 due to the high dielectric strength of the insulating tubing 330. The overall length 516 of the antenna 512 is:

$$\text{Coil Length } 516 = (N-1)(\text{Inter-turn spacing } 514) \quad [\text{Eq. 6}]$$

where N=the number of turns in antenna 512. Typically, N may range from 2 to 10, with a more preferred range from 3 to 5. The Faraday shield 570 is in contact with the outer diameter 586 of the plasma chamber 506. An additional benefit for the high dielectric strength insulating tubing 330 is that the voltage difference between the coil conductor 334 and the (typically grounded) Faraday shield 570 can be entirely supported across the wall thickness of the insulating tubing 330 thus antenna 512 may be in contact with the Faraday shield 570 at contact points 508.

Fourth Embodiment of the Invention

Figure 6:
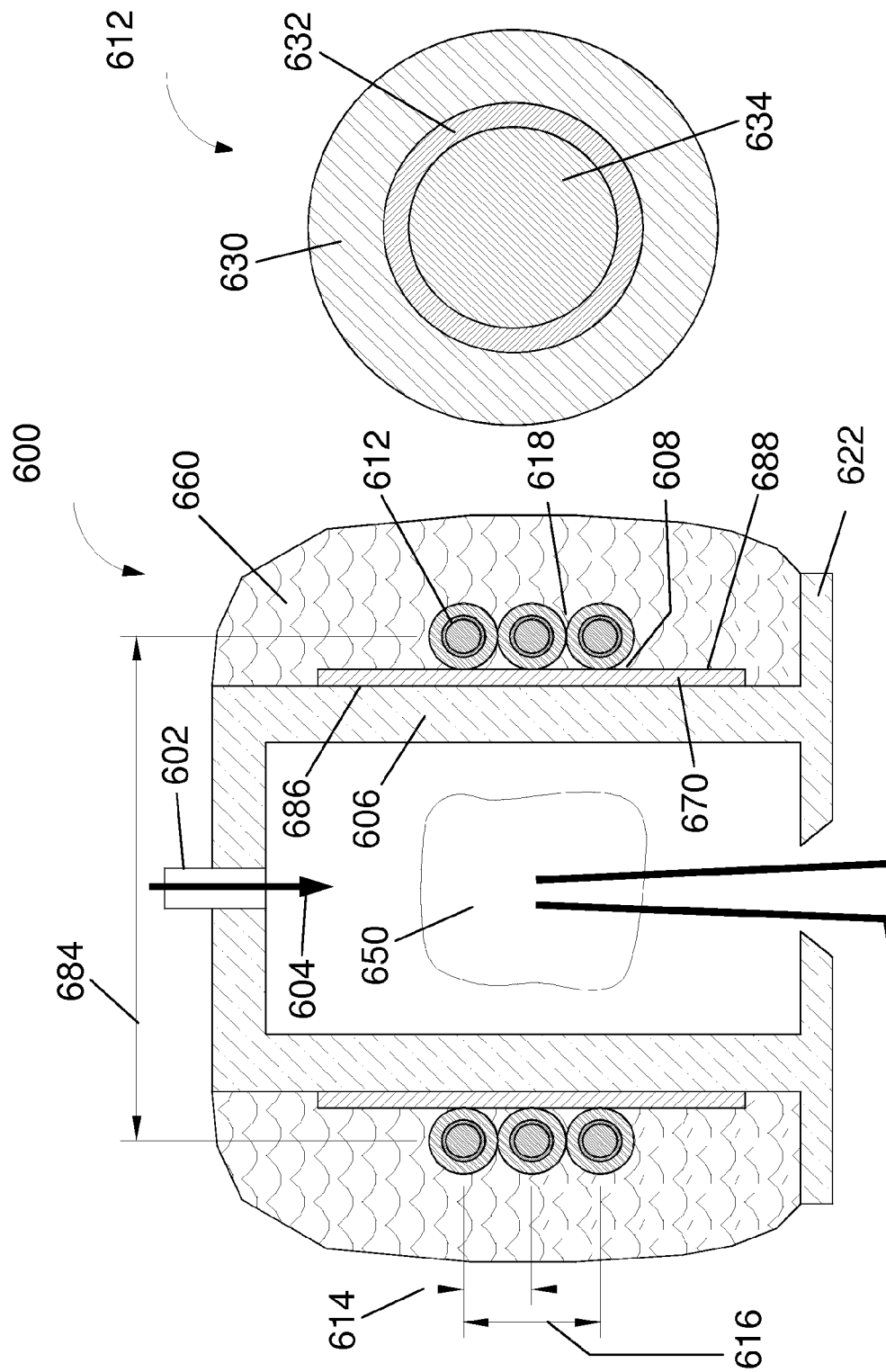
FIG. 6 is a schematic side cross-sectional view of a fourth embodiment of the invention employing an RF antenna with turns in contact with the Faraday shield and no inter-turn gaps, wherein the coil cooling fluid is external to the antenna.

FIG. 6 is a schematic side cross-sectional view of a fourth embodiment 600 of the invention employing an RF antenna 612 with turns in contact with a Faraday shield 670 and no inter-turn gaps, wherein the coil cooling fluid 660 is external to the antenna 612. A gas feed tube 602 at the top of the plasma chamber 606 permits a regulated flow of a feed gas 604 (i.e., the gas to be ionized) to flow into the interior of the plasma chamber 606. A flange 622 at the bottom end of the plasma chamber 606 enables mounting of the ion source 600 to a charged particle beam system (not shown). When power from an RF power supply (not shown) is connected to the antenna 612, an RF high voltage at typical frequencies of N×13.56 MHz (where N is an integer=1, 2, or 3) in the Industrial, Scientific and Medical (ISM) radio bands is generated across the antenna 612 which generates a time-varying axial magnetic field within the plasma chamber, as for the first, second, and third embodiments in FIGS. 3, 4, and 5, respectively. In some cases, the voltage differential between successive turns of the antenna 612 may exceed 400 Vrf, necessitating some form of high voltage insulation between neighboring turns of the antenna coil 612. Charged particles (ions or electrons) 620 may be extracted from the plasma 650 by a voltage applied to an extractor electrode (not shown) located below flange 622. The same considerations for the antenna diameter 684 and length 616 apply here as for the first three embodiments of the invention—optimum efficiency requires the minimum radial distance between the antenna 612 and the plasma 650, and the overall length 616 of the coil should be minimized to maximize the power density (W/cm$^3$) absorbed by the plasma 650 for a given RF power, potentially enabling higher emission currents in charged particle beam 620 (see FIG. 11). The same considerations for the maximum desirable plasma volume apply as for the first, second and third embodiments.

A detailed cross-sectional schematic view of one turn of the RF antenna 612 is shown at the right of FIG. 6. The coil wire 634 material is typically oxygen-free high-conductivity (OFHC) copper (with a typical diameter range from 2 to 10 mm, and a preferred range from 3 to 6 mm) which is annealed to enable winding of the coiled antenna structure 612 shown at the left of FIG. 6. The outer surface of coil wire 634 may have a conductive layer 632 (e.g., silver or gold) applied to reduce the coil resistance at RF frequencies. The same skin depth considerations apply here as for the first embodiment in FIG. 3, thus at an RF frequency of 40 MHz, if conductive layer 632 is silver, the skin depth will be will be approximately 10.1 μm, so if the thickness of conductive layer 632 is at least 30 to 40 μm (i.e., several times the skin depth, δ—see eq. 3), almost all the current in antenna coil 612 will flow in conductive layer 632, and not in coil wire 634. The thickness of layer 632 may range from 20 to 100 μm, and preferably from 25 to 50 μm.

Thick high density insulating tubing 630 typically fabricated from PTFE plastic, has been heat-shrunk onto the outer surface of the conductive layer 632, or onto the outer surface of coil wire 634 if no conductive layer 632 is used. A typical wall thickness range for the high dielectric strength insulating tubing 630 is 250 μm to 1250 μm. A preferred wall thickness range for insulating tubing 630 is 380 μm to 750 μm. The outer diameter of the insulating tubing 630 will be determined by the diameter of coil wire 634 plus twice the thickness of conductive layer 632 plus twice the thickness of insulating layer 630—giving a typical range from 2.54 mm [=2 mm+2 (20 μm)+2 (250 μm)] to 12.7 mm [=10 mm+2 (100 μm)+2 (1250 μm)], and a more preferred range from 3.81 mm [=3 mm+2 (25 μm)+2 (380 μm)] to 7.6 mm [=6 mm+2 (50 μm)+2 (750 μm)].

Note that here, unlike the case for the prior art in FIG. 2, the coolant fluid 660 is not required to stand off the entire voltage difference between neighboring turns of the antenna coil 612 since the majority (or all) of the inter-turn voltage differences within the antenna coil 612 may be stood off by the wall thickness of insulating tubing 630. This is also the case for the voltage differences between turns of the antenna coil 612 and the (grounded) Faraday shield 670. It is also important that the cooling fluid 660 be electrically transparent (i.e., minimally-absorbing) at the radio frequency driving the antenna 612 to avoid excessive RF power losses into the cooling fluid 660. The center-to-center spacing 614 between neighboring turns of the antenna 612 is equal to the outer diameter of the insulating layer 630. The overall length 616 (center-to-center) of the antenna 612 is:

Coil Length 616=(N−1)(Inter-turn spacing 614) [Eq. 7]

where N=the number of turns in antenna 612. A Faraday shield 670 is positioned near to, or in contact with, the outer diameter 686 of the plasma chamber 606. The Faraday shield 670 electrically shields the plasma 650 from the RF voltage on the antenna 612, thereby preventing capacitive coupling of the coil voltage into the energies of the ions 620 emitted by the plasma ion source 600. The same benefits for construction of a compact antenna 612 apply here as for antenna 512 in FIG. 5—the overall coil length 516 is minimized because no inter-turn gaps are required.

Plasma Ion Source Performance Calculations

Figure 7:
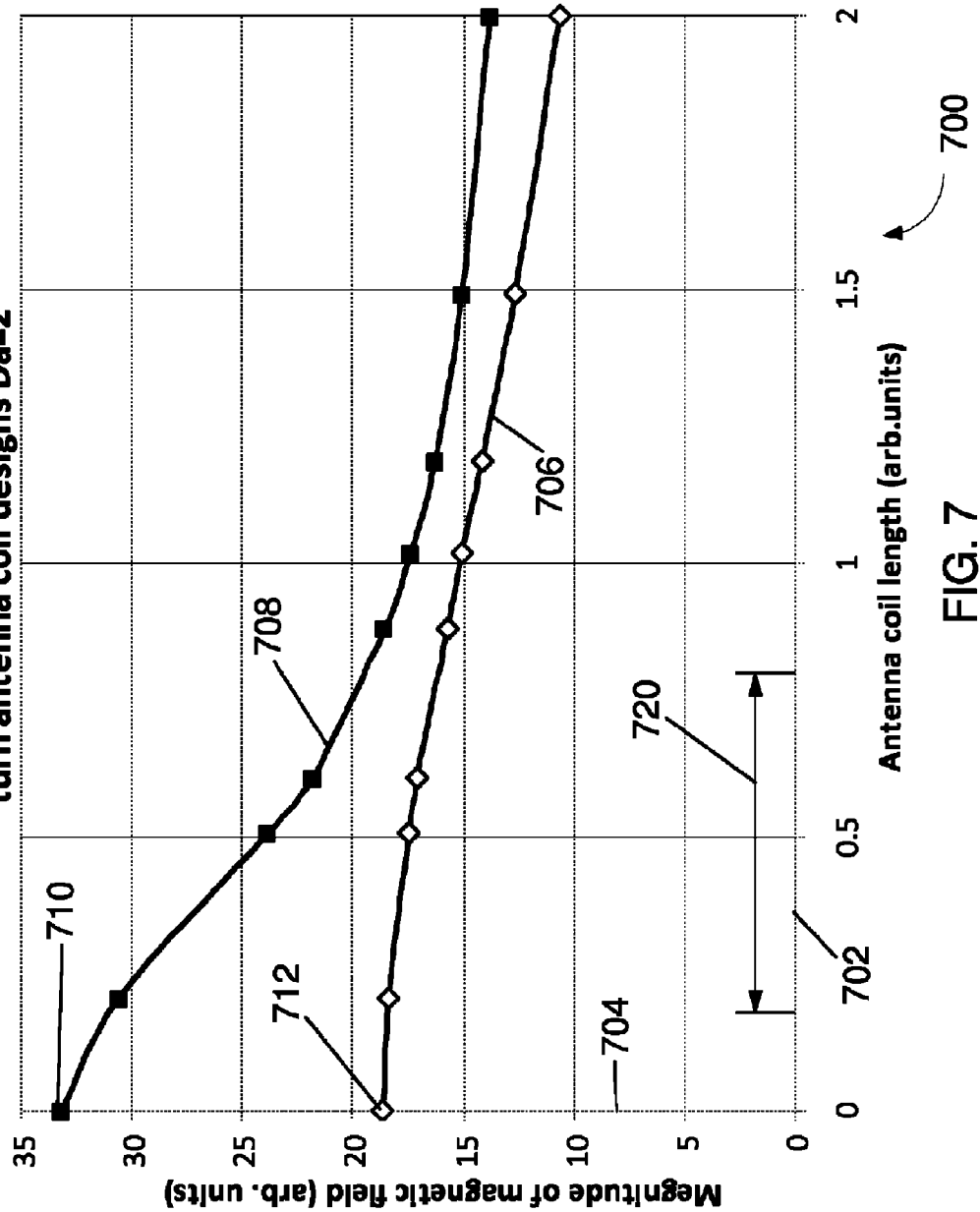
FIG. 7 is a graph of the magnetic fields generated by a prior art antenna and a compact antenna of the present invention as functions of the antenna coil length.

FIG. 7 is a graph 700 of the magnetic field magnitude 704 as a function of the normalized antenna coil length 702. The length normalization is in units of 40 mm, thus a normalized length of L=0.225 corresponds to an actual length of 0.225× 40 mm=9 mm. A portion 720 of this graph is shown in greater detail in FIG. 8. Curve 706 corresponds to the axial magnetic field on the axis of coils 112, 212, 312, 412, 512, or 612, in FIGS. 1-6, respectively. Curve 708 corresponds to the axial magnetic field near the outer edge of plasmas 150, 250, 350, 450, 550, 650, in FIGS. 1-6, respectively. As is always the case for any finite-length coil, the magnetic field strength off-axis 708 is stronger than the field strength on-axis 706. Also, the shorter the coil, the higher the magnetic field strengths on- and off-axis, reaching maxima for zero-length coils (i.e., coils with a single turn) for the case of a constant input RF power. This behavior is reasonable in light of the earlier discussion of power densities (W/cm$^3$) in the plasma—clearly the smallest plasma volume will be generated by single turn coils as the zero-length limit of coil length. Thus, the on-axis B-field strength 706 curve is highest 712 at zero-length. Similarly, the off-axis B-field strength 708 is highest 710 at zero-length. The antenna diameter is held fixed at a normalized value of 2.00 where the diameter normalization is in units of 20 mm, thus the far right of the graph (length=2×40 mm=80 mm) represents a coil with a normalized length twice the normalized diameter (diameter=2×20 mm=40 mm).

Figure 8:
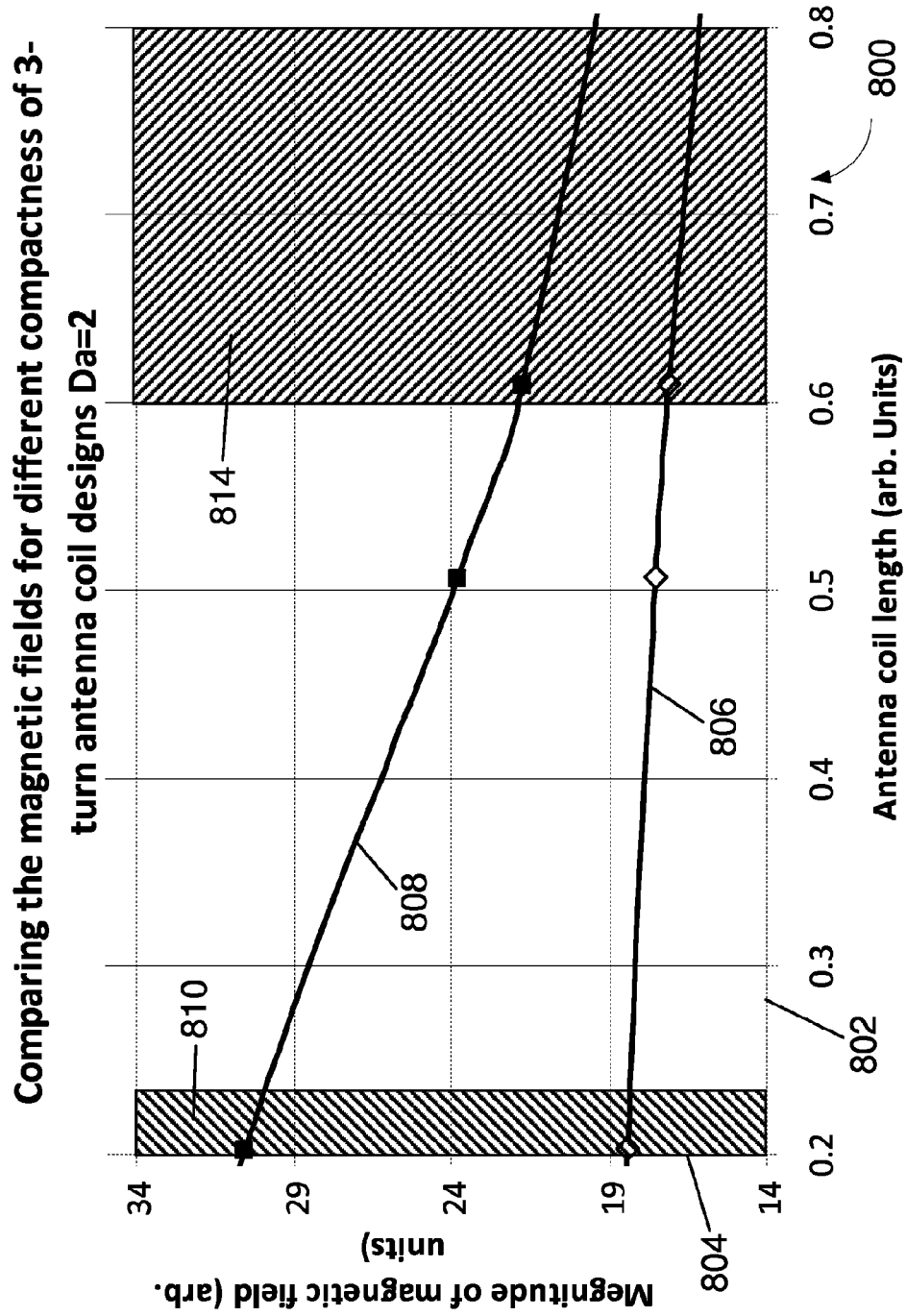
FIG. 8 is a close-up view of a portion of the graph in FIG. 7, showing coil lengths for the prior art and for the invention.

FIG. 8 is a close-up view 800 of a portion 720 of the graph in FIG. 7, showing coil lengths for a typical prior art antenna and for a typical compact antenna embodying the present invention. The normalized antenna coil length 802 ranges from 0.2 to 0.8 (8 to 32 mm). Curve 806 is a portion of curve 706 in FIG. 7, and curve 808 is a portion of curve 708 in FIG. 7. Length region 810 for some embodiments of the present invention ranges over normalized coil lengths 0.20-0.23 (8 to 9.2 mm), which are possible for some embodiments of the present invention due to the high dielectric strengths of the insulating layers 330 in FIGS. 3-5, and insulating layer 630 in FIG. 6. Length region 814 for the prior art ranges over normalized coil lengths ≥0.60 (24 mm) to which the prior art is typically restricted due to the low dielectric strengths of insulating coatings (such as coating 130 in FIG. 1).

Figure 9:
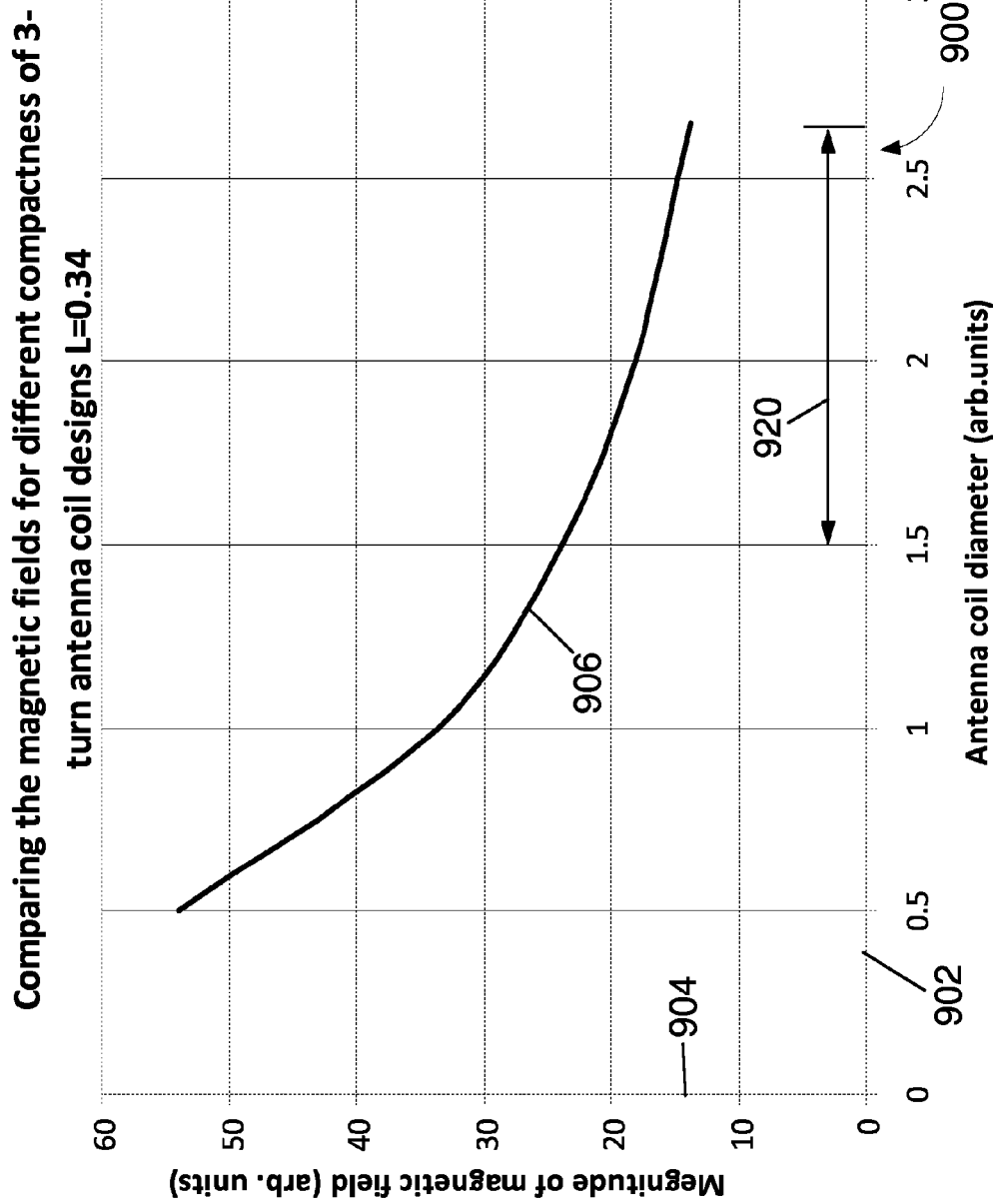
FIG. 9 is a graph of magnetic fields generated as functions of the antenna coil diameter.

FIG. 9 is a graph 900 of the magnetic field magnitude 904 as a function of the normalized antenna coil diameter 902. The diameter normalization is in units of 20 mm, thus a normalized diameter of Da=2.0 corresponds to an actual diameter of 2.0×20 mm=40 mm. A portion 920 of this graph is shown in greater detail in FIG. 10. Curve 906 corresponds to the calculated axial magnetic field on the axis of coils 112, 212, 312, 412, 512, or 612, in FIGS. 1-6, respectively, where the normalized coil length is held fixed at a value of L=0.34 (=13.6 mm—see FIGS. 7 and 8). As expected, the B-field gets monotonically stronger from right to left as the coil diameter 902 is decreased. Again the benefits of the high dielectric strength heat-shrink insulating tubing (such as tubing 330 in FIGS. 3-5, or insulating tubing 630 in FIG. 6) compared with insulating prior art coatings (such as coating 130 in FIG. 1) are clear as far as the ability to reduce the coil diameter and thereby increase the axial magnetic field.

Figure 10:
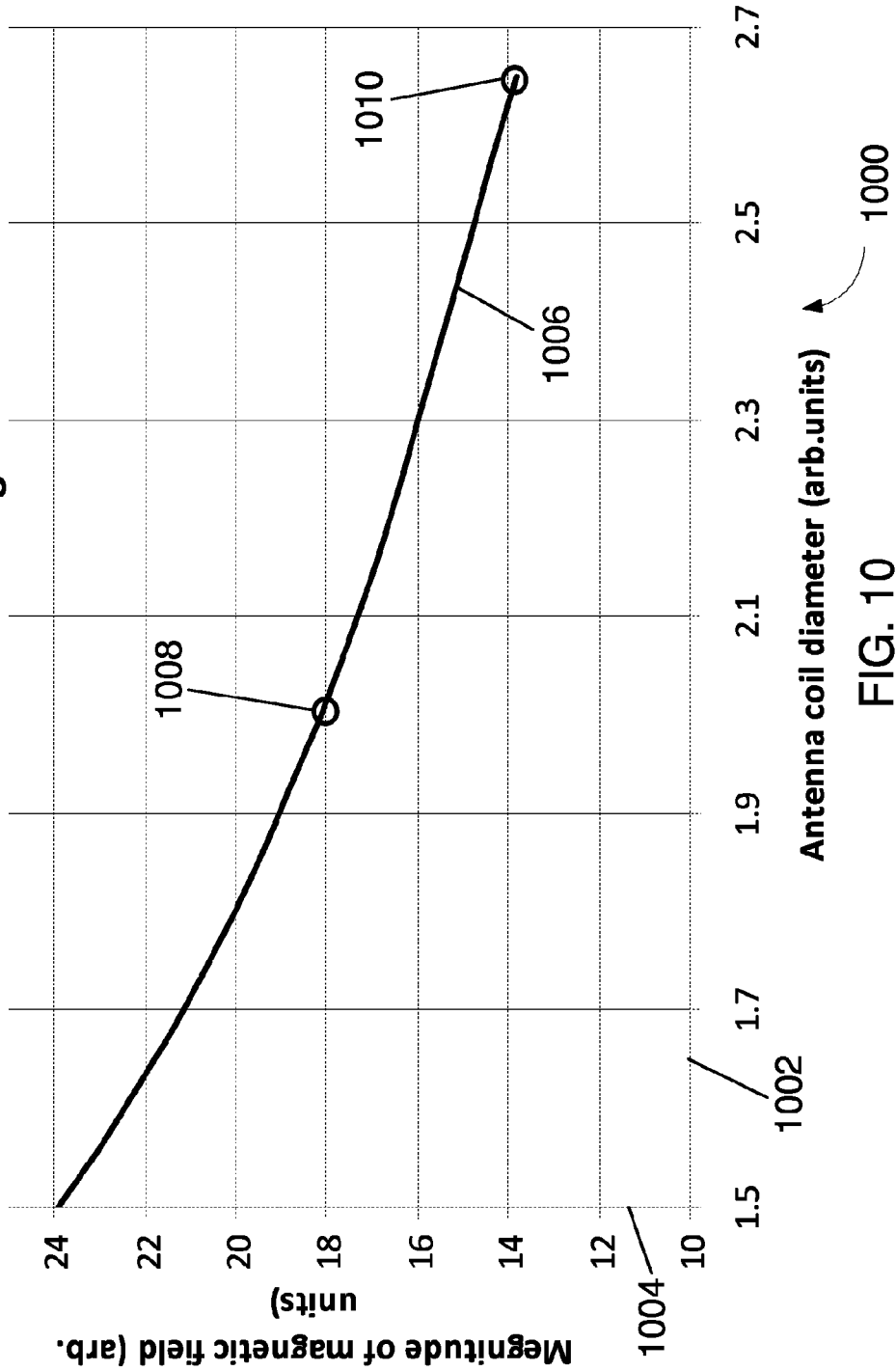
FIG. 10 is a close-up view of a portion of the graph in FIG. 9.

FIG. 10 is a close-up view 1000 of a portion 920 of the graph in FIG. 9, showing normalized coil diameters 1002 ranging from 1.5 to 2.7 (=30 to 54 mm), which range includes coil diameters of typical prior art antennas and of typical embodiments of the present invention. Curve 1006 is a portion of curve 906 in FIG. 9. The prior art is typically restricted to normalized coil diameters 1010 greater than 2.65 (=53 mm) due to the need to maintain larger coil diameters to achieve the necessary voltage standoffs. Embodiments of the present invention utilize coil diameters 1008 down to at least 2.0 (=40 mm) since inter-turn gaps are unnecessary with the high voltage standoff capability of the insulating coatings 330 (FIG. 3-5) or 630 (FIG. 6).

FIG. 11 is a graph 1100 of plasma source emission currents (in μA) 1104 as functions of the input RF power (in W) 1102 for typical prior art plasma ion sources (curves 1106 and 1108) and for plasma sources embodying the present invention 1110. Typical prior art curve 1106 corresponds to a normalized coil length of 0.425 (=17 mm) and a normalized coil diameter of 2.65 (=53 mm)—this is a relatively loosely-wound coil. Typical prior art curve 1108 corresponds to a more tightly-wound coil with a normalized coil length of 0.225 (=45 mm), but still with a larger normalized coil diameter or 2.65 (=53 mm). Curve 1110 for some embodiments of the present invention corresponds to a normalized coil length of 0.225 (=9 mm) and a normalized coil diameter of 2.0 (=40 mm)—this is a more tightly-wound coil with an outer diameter much closer to the outer edge of the plasma, giving better RF power coupling.

Due to less efficient RF power coupling in typical prior art inductively coupled plasma ion sources, much lower emission currents 1104 are generated for a given input RF power than is the case for plasma ion sources of the present invention. In addition, some embodiments of the present invention are capable of operating at much lower input RF powers, down to 50 W, while typical prior art sources can only function down to 300 W. This difference arises since some embodiments of the present invention can generate the same ion emission current at RF inputs powers of 50 W that the typical prior art sources generate using RF input powers of approximately 300 W as shown on graph 1100. The reason for this is the higher RF power coupling efficiency of some embodiments the present invention. At input powers of 300 W, as much as 250 W does not produce plasma, giving the equivalence between the ion emission currents at 300 W for the prior art in comparison with 50 W for the invention. Some embodiments of the present invention can also operate at higher RF input powers than the typical prior art since there is less "wasted" RF input power going towards heating the source structure rather than generating useful plasma. Thus, at 800 W input RF power to some embodiments of the present invention, there is less heating power into the source than there is for a typical prior art plasma ion sources operating at powers between 600 and 700 W.

Other benefits of the more efficient RF power coupling to the plasma in the present invention include easier plasma ignition, the ability to maintain the plasma under difficult conditions (such as low feed gas pressure, or a difficult feed gas to ionize), and more efficient use of the input RF power, enabling lower-power RF supplies (at a lower cost) than would be possible with prior art plasma ion sources. A further benefit of the high efficiency compact antenna of the present invention is a substantial reduction in the coil heat removal requirements achieved through more efficient use of the input RF power.

A benefit of a thick insulating tubing 330, compared with the thin insulating coating 130 is the superior resistance to cuts and abrasion—this can enhance the plasma source lifetime since even a single break in the coil insulation can render the plasma ion source inoperable due to high voltage breakdown. With this tough and very flexible antenna design, more complex RF antennas than the helical windings illustrated in FIGS. 3-6 may be fabricated to address more challenging source performance requirements. The high voltage isolation benefits of the thick insulating tubing 330 relative to the insulating coating 130 arise from three factors: 1) greater thickness, 2) higher density, and 3) lower porosity. All three of these advantages are inherent in the properties of heat-shrink insulating tubing, and thus also represent inherent advantages to the present invention over the prior art which employed insulating coatings. Example high voltage strengths of insulating PTFE heat-shrink tubing exceed 1400 V/mil=55 V/μm, while insulating PTFE coatings may have high voltage strengths in the range of 400 V/mil=15.8 V/μm or less due to its low density of the coated films. In addition, it is difficult to deposit PTFE coatings with thicknesses comparable to the wall thicknesses of commercially-available PTFE heat-shrink tubing.

The details of the inductively-coupled plasma ion sources illustrated in FIGS. 3-6 are for exemplary purposes only—many other source designs are possible within the scope of the present invention. For example, the RF antennas may have less than or more than three turns, or the antenna could be wound into different (non-helical) shapes. The Faraday shield may have a shape other than a cylinder, for example, with flanges extending outwards from the top end and/or the bottom end of a cylindrical central portion. The shape of the plasma chamber may differ from the "top hat" configuration shown here.

Although the insulating tubing 330 and 630 have been described in terms of heat-shrink polytetrafluoroethylene (PTFE or Teflon™), other high dielectric strength materials may be used for insulating tubing 330 and 630.

A preferred method or apparatus of the present invention has many novel aspects, and because the invention can be embodied in different methods or apparatuses for different purposes, not every aspect or benefit need be present in every embodiment. Moreover, many of the aspects of the described embodiments may be separately patentable or patented.

Although the description of the present invention above is mainly directed at an apparatus, it should be recognized that methods of using the novel apparatus described herein would also be within the scope of the present invention. Further, it should be recognized that embodiments of the present invention can be implemented via computer hardware or software, or a combination of both. The implementation can be accomplished using standard programming techniques—including the use of non-transitory tangible computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, the apparatus described herein may make use of any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine readable code, or portions thereof, may be transmitted over a wired or wireless network. The invention described herein includes these and other various types of non-transitory tangible computer-readable storage media when such media contain instructions or programs for implementing the steps described above in conjunction with a microprocessor or other data processor. The invention also includes the computer itself when programmed according to the methods and techniques described herein.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. An inductively coupled plasma ion source for a focused charged particle beam system, comprising:
   a plasma chamber;
   a gas feed tube for introducing a feed gas into the plasma chamber;
   a radio frequency antenna, positioned around the plasma chamber, comprising:
      a coil of conductive material; and
      insulating tubing surrounding and in contact with the outer surface of the coil of conductive material, wherein the insulating tubing has high dielectric strength greater than 25 kV/mm and has a wall thickness between 250 μm and 1250 μm; and
   a radio frequency power supply, electrically connected to the radio frequency antenna, and configured to provide power to the antenna.

2. The inductively coupled plasma ion source of claim 1, wherein the conductive material is conductive tubing.

3. The inductively coupled plasma ion source of claim 1, wherein the conductive material is conductive wire.

4. The inductively coupled plasma ion source of claim 1, further comprising a conductive layer between the outer surface of the conductive material and the inner surface of the insulating tubing, wherein the thickness of the conductive layer is between 20 and 100 μm.

5. The inductively coupled plasma ion source of claim 4, wherein the thickness of the conductive layer is between 25 and 50 μm.

6. The inductively coupled plasma ion source of claim 4, wherein the conductive layer comprises silver or gold.

7. The inductively coupled plasma ion source of claim 1, wherein the insulating tubing comprises polytetrafluoroethylene (PTFE).

8. The inductively coupled plasma ion source of claim 1, wherein the insulating tubing is heat-shrunk onto the outer surface of the coil of conductive material.

9. The inductively coupled plasma ion source of claim 1, wherein the insulating tubing has a wall thickness between 380 μm to 750 μm.

10. The inductively coupled plasma ion source of claim 1, wherein the conductive material comprises Oxygen Free High Conductivity (OFHC) copper.

11. The inductively coupled plasma ion source of claim 1, wherein the center-to-center spacing between successive turns in the coil of conductive material is approximately equal to the outer diameter of the insulating tubing.

12. The inductively coupled plasma ion source of claim 1, further comprising a Faraday shield, positioned between the outer surface of the plasma chamber and the inner diameter of the coil of conductive material.

13. The inductively coupled plasma ion source of claim 12, wherein the insulating tubing is in contact with the outer surface of the Faraday shield.

14. The inductively coupled plasma ion source of claim 1, wherein the radio frequency antenna is immersed in a dielectric fluid.

15. An inductively coupled plasma ion source for a focused charged particle beam system, comprising:
   a plasma chamber;
   a gas feed tube for introducing a feed gas into the plasma chamber;
   a radio frequency antenna, positioned around the plasma chamber, comprising:
      a coil of conductive tubing;
      a conductive layer on the outer surface of the conductive tubing; and
      insulating tubing surrounding and in contact with the outer surface of the conductive layer, wherein the insulating tubing has high dielectric strength greater than 25 kV/mm and has a wall thickness between 250 μm and 1250 μm; and wherein the center-to-center spacing between successive turns in the coil of conductive tubing is approximately equal to the outer diameter of the insulating tubing;
   a Faraday shield, positioned between the outer surface of the plasma chamber and the inner diameter of the coil of conductive tubing; and
   a radio frequency power supply, electrically connected to the radio frequency antenna, and configured to provide power to the antenna.

16. The inductively coupled plasma ion source of claim 15, wherein the insulating tubing is in contact with the outer surface of the Faraday shield.

17. The inductively coupled plasma ion source of claim 15, wherein the conductive layer comprises silver or gold.

18. The inductively coupled plasma ion source of claim 15, wherein the insulating tubing comprises polytetrafluoroethylene (PTFE).

19. The inductively coupled plasma ion source of claim 15, wherein the insulating tubing is heat-shrunk onto the outer surface of the conductive layer.

20. The inductively coupled plasma ion source of claim 15, wherein the insulating tubing has a wall thickness between 380 μm to 750 μm.

21. The inductively coupled plasma ion source of claim 15, wherein the conductive tubing comprises Oxygen Free High Conductivity (OFHC) copper.

* * * * *